(12) United States Patent
Wu

(10) Patent No.: US 12,224,206 B2
(45) Date of Patent: Feb. 11, 2025

(54) CONDUCTIVE STRUCTURE, SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Ping-Heng Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 530 days.

(21) Appl. No.: 17/456,631

(22) Filed: Nov. 26, 2021

(65) Prior Publication Data

US 2022/0115295 A1   Apr. 14, 2022

Related U.S. Application Data

(63) Continuation of application No. PCT/CN2021/104922, filed on Jul. 7, 2021.

(30) Foreign Application Priority Data

Oct. 13, 2020   (CN) .......................... 202011091938.0

(51) Int. Cl.
*H01L 21/768* (2006.01)
*H01L 23/48* (2006.01)
*H01L 25/065* (2023.01)

(52) U.S. Cl.
CPC ...... *H01L 21/76898* (2013.01); *H01L 23/481* (2013.01); *H01L 25/0657* (2013.01); *H01L 2225/06544* (2013.01)

(58) Field of Classification Search
CPC ............. H01L 23/481; H01L 21/76898; H01L 2225/06544; H01L 25/0657
See application file for complete search history.

(56) References Cited

U.S. PATENT DOCUMENTS

| 7,276,787 B2 | 10/2007 | Edelstein et al. |
| 8,349,735 B2 | 1/2013 | Pagaila et al. |
| 9,147,609 B2 | 9/2015 | Jebory |
| 9,754,825 B2 | 9/2017 | Li et al. |

(Continued)

FOREIGN PATENT DOCUMENTS

| CN | 1684256 A | 10/2005 |
| CN | 102412197 A | 4/2012 |

(Continued)

OTHER PUBLICATIONS

International Search Report (ISR) in international application No. PCT/CN2021/104922 mailed on Oct. 11, 2021.

(Continued)

*Primary Examiner* — Ratisha Mehta
*Assistant Examiner* — Brad A Knudson
(74) *Attorney, Agent, or Firm* — Syncoda LLC; Feng Ma

(57) ABSTRACT

A conductive structure includes: a conductive pillar and at least one embedded block arranged in the conductive pillar, a coefficient of thermal expansion of the embedded block being less than that of the conductive pillar. When the conductive pillar is heated and expanded, an extrusion effect of the conductive pillar on a structure adjacent to the conductive pillar can be reduced, thereby improving the performance of the semiconductor structure.

10 Claims, 8 Drawing Sheets

(56) References Cited

U.S. PATENT DOCUMENTS

| | | | |
|---|---|---|---|
| 2012/0267788 A1* | 10/2012 | Hong | H01L 21/76898 257/774 |
| 2013/0087928 A1* | 4/2013 | Pagaila | H01L 21/76898 257/774 |
| 2013/0127019 A1* | 5/2013 | Lee | H01L 23/481 257/E23.141 |
| 2013/0161828 A1* | 6/2013 | Lamy | H01L 23/5384 257/774 |
| 2013/0234325 A1 | 9/2013 | Dai et al. | |
| 2015/0115462 A1* | 4/2015 | Lin | H01L 23/49827 257/774 |
| 2017/0200644 A1* | 7/2017 | Aoyagi | H01L 21/76895 |
| 2018/0145011 A1* | 5/2018 | Lin | H01L 24/92 |
| 2022/0037256 A1* | 2/2022 | Shih | H01L 21/76898 |

FOREIGN PATENT DOCUMENTS

| | | |
|---|---|---|
| CN | 105612610 A | 5/2016 |
| CN | 111081666 A | 4/2020 |

OTHER PUBLICATIONS

A. Heryanto etc. "Effect of Copper TSV Annealing on Via Protrusion for TSV Wafer Fabrication", https://sci-hub.se/10.1007/s11664-012-2117-3.

* cited by examiner

CONDUCTIVE STRUCTURE, SEMICONDUCTOR STRUCTURE AND MANUFACTURING METHOD THEREOF

CROSS-REFERENCE TO RELATED APPLICATIONS

This is a continuation of International Patent Application No.: PCT/CN2021/104922 filed on Jul. 7, 2021, which claims priority to Chinese Patent Application No. 202011091938.0 filed on Oct. 13, 2020. The disclosures of the above-referenced applications are incorporated herein by reference in their entirety.

BACKGROUND

In a semiconductor structure, chips or wafers can be interconnected by manufacturing via holes in a vertical direction. Such an interconnecting technology is called a Through Silicon Via (TSV) technology. The through silicon via technology is one of the most potential packaging technologies due to its advantages of high stack density in a three-dimensional direction, a small size after packaging, low power consumption, or the like, and thus is widely used in various circuits and systems.

SUMMARY

Embodiments of the present disclosure relate to the field of semiconductors, and in particular, to a conductive structure, a semiconductor structure and a manufacturing method thereof.

The embodiments of the present disclosure provide a conductive structure, a semiconductor structure and a manufacturing method thereof, so as to solve a problem of poor performance of the semiconductor structure caused by unnecessary extrusion to a structure adjacent to a conductive pillar when the conductive pillar is heated and expanded.

In order to solve the above problem, the embodiments of the present disclosure provide a conductive structure, including: a conductive pillar and at least one embedded block arranged in the conductive pillar, a coefficient of thermal expansion of the embedded block being less than that of the conductive pillar.

The embodiments of the present disclosure further provide a semiconductor structure, including: a conductive pillar and at least one embedded block, the conductive pillar being in contact with the embedded block, and a coefficient of thermal expansion of the embedded block being less than that of the conductive pillar.

The embodiments of the present disclosure further provide a semiconductor structure manufacturing method, including: providing a base; etching the base to form at least one first through hole; filling the first through hole to form an embedded block; etching the base to form at least one second through hole, at least one embedded block being located in the second through hole; and filling the second through hole to form a conductive pillar, a coefficient of thermal expansion of the embedded block being less than that of the conductive pillar.

BRIEF DESCRIPTION OF THE DRAWINGS

One or more embodiments are exemplarily described by using figures that are corresponding thereto in the accompanying drawings; the exemplary descriptions do not constitute limitations on the embodiments. Unless otherwise particularly stated, the figures in the accompanying drawings do not constitute a scale limitation.

DETAILED DESCRIPTION

Figure 1:
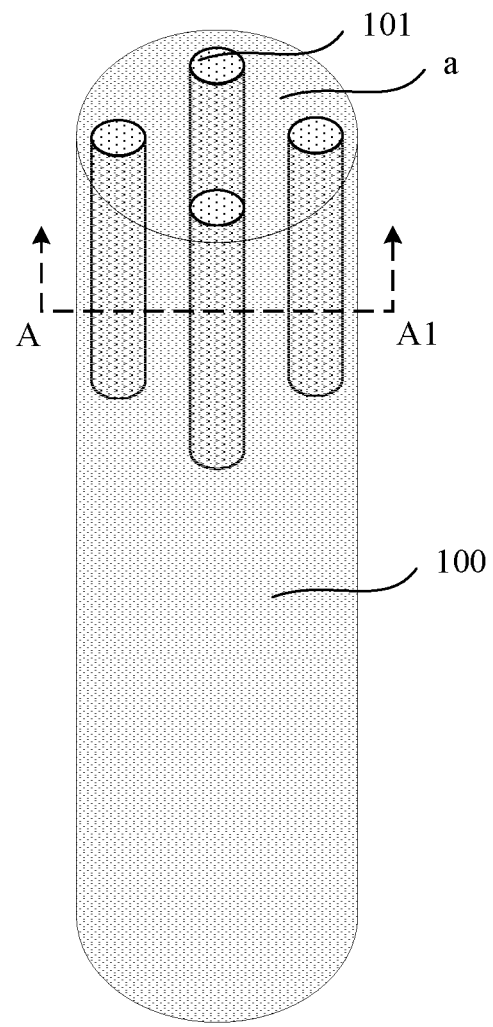
FIG. 1 is a schematic three-dimensional structural diagram of a conductive structure according to an embodiment of the present disclosure.

A typical through silicon via is generally filled with a metal material to form a conductive pillar. The conductive pillar can be utilized to realize an electrical connection between different layers or directly form a dummy TSV to enhance heat dissipation performance. However, due to a large coefficient of thermal expansion difference between the conductive pillar and a structure adjacent to the conductive pillar, the conductive pillar, when thermally expanded, easily extrudes the structure adjacent to the conductive pillar, resulting in poor performance of the semiconductor structure.

That is, the conductive pillar is heated and expanded, causing unnecessary extrusion to the structure adjacent to the conductive pillar and resulting in poor performance of the semiconductor structure.

It is found through analysis that the conductive pillar is generally made of a metal material with a large coefficient of thermal expansion, such as copper, and the coefficient of thermal expansion of the conductive pillar differs greatly from that of the adjacent structure. After the semiconductor structure is heated, with an increasing temperature, the conductive pillar and the adjacent structure are heated and expanded, resulting in a large thermal stress inside the conductive pillar, and a thermal expansion volume of the conductive pillar is larger than an expansion volume of the adjacent structure, thereby extruding the structure adjacent to the conductive pillar and even causing irreversible deformation of the structure adjacent to the conductive pillar, and then affecting the structural stability between the conductive pillar and some structures adjacent to the conductive pillar, such as the deterioration of the electrical connection performance.

It is found through further analysis that the conductive pillar may undergo multiple annealing processes during the manufacturing of the semiconductor structure, and a high temperature in the annealing process is one of the main sources of heat for the conductive pillar. For example, after a through silicon via is filled with copper to form a conductive pillar, tempering recrystallization processing is further required to be performed on the conductive pillar to reduce a void ratio of the material filling the via and then improve the conductivity of the conductive pillar. The tempering recrystallization processing is an annealing process.

In order to solve the above problem, an embodiment of the present disclosure provides a conductive structure. A coefficient of thermal expansion of an embedded block in a conductive pillar is less than that of the conductive pillar, and then an overall coefficient of thermal expansion of the conductive structure decreases. When the conductive structure is heated and expanded, an expansion volume of the conductive structure decreases, thereby helping reduce an extrusion effect of the conductive structure on a structure adjacent to the conductive structure.

In order to make objectives, technical solutions and advantages of the embodiments of the present disclosure clearer, various embodiments of the present disclosure will be described below in details with reference to the drawings. However, those of ordinary skill in the art may understand that, in the embodiments of the present disclosure, numerous technical details are set forth in order to enable a reader to better understand the present disclosure. However, the technical solutions claimed in the present disclosure can be implemented without these technical details and various changes and modifications based on the embodiments below.

Figure 3:
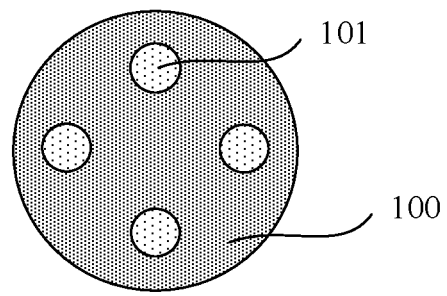
FIG. 3 is a schematic sectional structural diagram taken along a direction AA1 in FIG. 1.

FIG. 1 is a schematic three-dimensional structural diagram of a conductive structure according to an embodiment of the present disclosure. FIG. 3 is a schematic sectional structural diagram taken along a direction AA1 in FIG. 1.

Referring to FIG. 1, in this embodiment, the conductive structure includes: a conductive pillar 100 and at least one embedded block 101. The conductive pillar 100 is in contact with the embedded block 101, and a coefficient of thermal expansion of the embedded block 101 is less than that of the conductive pillar 100.

The coefficient of thermal expansion of the embedded block 101 is less than that of the conductive pillar 100, which helps reduce an overall coefficient of thermal expansion of the conductive structure, so that, when the conductive structure is heated and expanded, an expansion volume of the conductive structure decreases, thereby helping reduce an extrusion effect of the conductive structure on a structure adjacent to the conductive structure.

Figure 2:
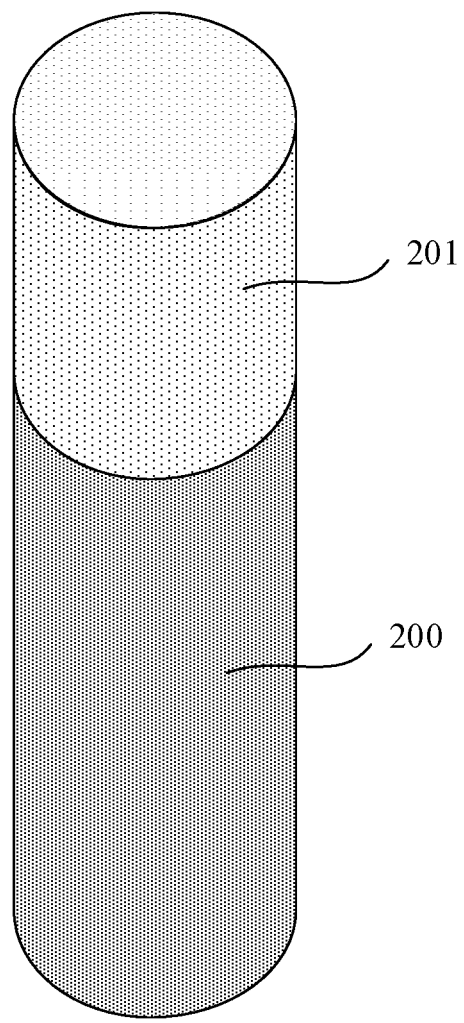
FIG. 2 is another schematic three-dimensional structural diagram of the conductive structure according to an embodiment of the present disclosure.

In this embodiment, referring to FIG. 1, the conductive pillar 100 is provided with the at least one embedded block 101. In other embodiments, referring to FIG. 2, an embedded block 201 is not embedded in a conductive pillar 200, but an end surface of the conductive pillar 200 is in contact with that of the embedded block 201. In other embodiments, the embedded block may also be partially embedded in the conductive pillar.

The embedded block 101 is made of a silicon-containing material or a metal material.

Specifically, the silicon-containing material includes at least one of silicon, silicon oxide, silicon nitride, silicon oxynitride, silicon carbide, silicon carbon nitride and silicon oxycarbide; the metal material includes at least one of tin, titanium, gold, nickel and palladium.

In this embodiment, the conductive pillar 100 may be provided with a plurality of embedded blocks 101 separated from each other. On the one hand, since the coefficient of thermal expansion of the embedded block 101 is less than that of the conductive pillar 100, the more the number of the embedded block 101 in the conductive pillar 100 is, the more beneficial it is to reduce the overall coefficient of thermal expansion of the conductive structure. On the other hand, the plurality of embedded blocks 101 are separated from each other, and part of the conductive pillar 100 in contact with the embedded blocks 101 is divided into a plurality of regions. When the part of the conductive pillar 100 is heated and expanded, since the embedded blocks 101 are spaced between the part of the conductive pillar 100, the embedded block 101 can block or disperse an external thermal expansion stress generated by the part of the conductive pillar, thereby reducing an extrusion effect of the conductive structure on a structure adjacent to the conductive structure. Further, the conductive structure may not play a role of electrical connection, but can enhance the heat dissipation performance of the conductive structure.

In addition, extension directions of the plurality of embedded blocks 101 are parallel to each other and parallel to an extension direction of the conductive pillar 100. When the number of the embedded block 101 is fixed and the embedded blocks 101 have a same shape and size, a total volume of the plurality of embedded blocks 101 embedded in the conductive structure is larger when the extension directions of the plurality of embedded blocks 101 are parallel to the extension direction of the conductive pillar 100 than when the extension directions of the plurality of embedded blocks 101 intersect with the extension direction of the conductive pillar, which is conducive to further reduction of the overall coefficient of thermal expansion of the conductive structure and is more conducive to reduction of the extrusion effect on the structure adjacent to the conductive structure when the conductive structure is heated and expanded.

Referring to FIG. 3, the plurality of embedded blocks 101 are wrapped around a central axis of the conductive pillar 100. 4 embedded blocks 101 are taken as an example in FIG. 3. In other embodiments, the number of the embedded block may be arbitrary, such as 2, 6 or 7.

In addition, in this embodiment, a sectional shape of the embedded block 101 is circular along a sectional direction perpendicular to the extension direction of the conductive pillar 100. In other embodiments, the sectional shape of the embedded block may also be rectangular, oval, annular, trapezoidal or the like.

In this embodiment, referring to FIG. 1, an end surface a of the conductive pillar 100 is exposed to the embedded block 101; that is, the end surface a of the conductive pillar 100 is flush with an end surface of the embedded block 101. In this way, on the one hand, due to the presence of the embedded block 101, the external thermal expansion stress generated by the whole conductive structure can be reduced; on the other hand, since a contact area between the conductive pillar 100 and a structure in contact with its end surface is reduced, when the conductive pillar 100 is heated and expanded to exert pressure on the structure in contact with its end surface, an acting area of the pressure on the structure in contact with its end surface is also reduced, which thus helps reduce the extrusion effect of the conductive structure on the structure adjacent thereto.

It is to be noted that, in other embodiments, the end surface of the conductive pillar may not be exposed to the embedded block; that is, a certain distance exists between the end surface of the conductive pillar and the end surface of the embedded block.

In addition, in this embodiment, a ratio of a length of the embedded block 101 to a length of the conductive pillar 100 ranges from 1/5 to 1/3 along the extension direction of the conductive pillar 100. The range of the ratio of the length of the embedded block 101 to the length of the conductive pillar 100 is controlled to enable a reduction effect of the embedded block 101 on the overall coefficient of thermal expansion of the conductive structure to meet a preset requirement, which further ensures a small enough expansion volume when the conductive structure is heated and expanded and then has a small extrusion effect on the structure adjacent to the conductive structure.

Specific distribution of the embedded block 101 in the conductive pillar 100 is described below with reference to FIG. 4 to FIG. 11, FIG. 4 to FIG. 11 are several schematic sectional structural diagrams of one end of a conductive pillar provided with an embedded block.

Figure 4:
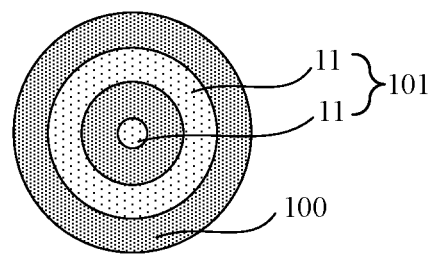
FIG. 4 is a first schematic sectional structural diagram of one end of a conductive pillar provided with an embedded block according to an embodiment of the present disclosure.

Example 1: Referring to FIG. 4, the embedded block 101 includes at least one first embedded block 11. A central axis of the first embedded block 11 coincides with that of the conductive pillar 100.

In this embodiment, when a number of the first embedded block 11 is fixed and each first embedded block 11 has a fixed shape and size, the central axis of the first embedded block 11 coincides with that of the conductive pillar 100, so that the first embedded block 11 located in the conductive pillar 100 can have a maximum total volume, and an effect of reducing the overall coefficient of thermal expansion of the conductive structure is better.

Specifically, in an example where two first embedded blocks 11 are provided: the first embedded block 11 in the center is of a cylindrical structure, and a central axis of the cylindrical structure coincides with that of the conductive pillar 100; the first embedded block 11 on the periphery is of a closed annular structure which surrounds the periphery of the cylindrical structure, and a central axis of the closed annular structure coincides with that of the conductive pillar 100. It may be understood that the first embedded block 11 in the center may also be of an annular structure.

It may be further understood that, in a case where only one first embedded block is provided, the first embedded block may be of a cylindrical structure or a closed annular structure. In addition, 2 or more first embedded blocks may also be provided.

Figure 5:
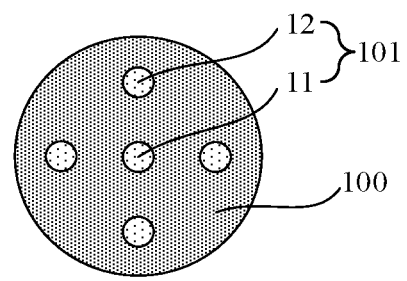
FIG. 5 is a second schematic sectional structural diagram of one end of a conductive pillar provided with an embedded block according to an embodiment of the present disclosure.
Figure 6:
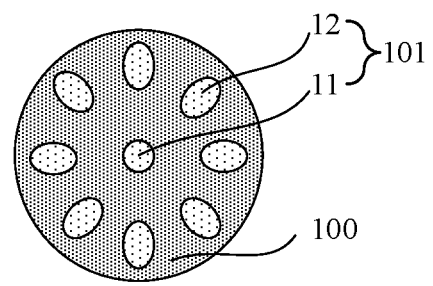
FIG. 6 is a third schematic sectional structural diagram of one end of a conductive pillar provided with an embedded block according to an embodiment of the present disclosure.

Example 2: Referring to FIG. 5 and FIG. 6, the embedded block 101 includes at least one first embedded block 11, a central axis of the first embedded block 11 coinciding with that of the conductive pillar 100; and further includes a plurality of second embedded blocks 12 spaced around the first embedded block 11.

On the one hand, the plurality of second embedded blocks 12 are added on the basis of the first embedded block 11, which can further reduce the overall coefficient of thermal expansion of the conductive structure; on the other hand, the plurality of second embedded blocks 12 are spaced around the first embedded block 11, and part of the conductive pillar 100 in contact with the first embedded block 11 and the second embedded blocks 12 is divided into a plurality of regions. When the part of the conductive pillar 100 is heated and expanded, since the plurality of second embedded blocks 12 are spaced between the part of the conductive pillar 100, the second embedded block 12 can block or disperse an external thermal expansion stress generated by the conductive pillar 100, thereby reducing an extrusion effect of the conductive structure on the structure adjacent to the conductive structure.

In addition, a distance between the first embedded block 11 and the end surface a (refer to FIG. 1) of the conductive pillar 100 may be less than or equal to that between the second embedded block 12 and the end surface a of the conductive pillar 100. In other embodiments, the distance between the first embedded block and the end surface of the conductive pillar and the distance between the second embedded block and the end surface of the conductive pillar may not be limited.

Specifically, referring to FIG. 5, a sectional shape of the second embedded block 12 is circular. Four second embedded blocks 12 are taken as an example in FIG. 5. A number of the second embedded block 12 is not actually limited. Referring to FIG. 6, a sectional shape of the second embedded block 12 is oval. Eight second embedded blocks 12 are taken as an example in FIG. 6. A number of the second embedded block 12 is not actually limited.

Figure 7:
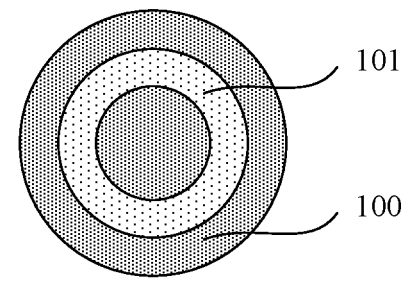
FIG. 7 is a fourth schematic sectional structural diagram of one end of a conductive pillar provided with an embedded block according to an embodiment of the present disclosure.
Figure 8:
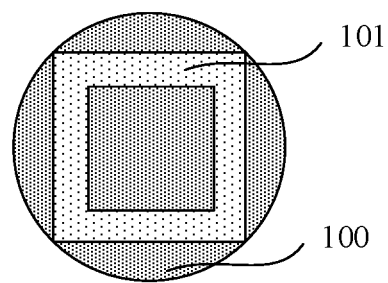
FIG. 8 is a fifth schematic sectional structural diagram of one end of a conductive pillar provided with an embedded block according to an embodiment of the present disclosure.
Figure 9:
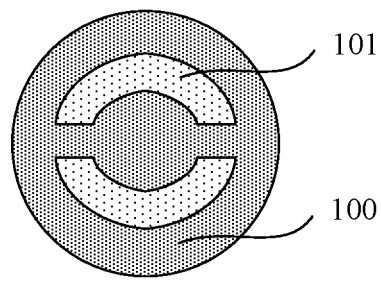
FIG. 9 is a sixth schematic sectional structural diagram of one end of a conductive pillar provided with an embedded block according to an embodiment of the present disclosure.

Example 3: Referring to FIG. 7 to FIG. 9, at least one embedded block 101 encloses an annular structure; or a plurality of embedded blocks 101 enclose an annular structure.

Specifically, referring to FIG. 7, a single embedded block 101 encloses a closed ring structure. Specifically, referring to FIG. 8, a single embedded block 101 encloses a closed square-ring structure. Alternatively, referring to FIG. 9, at least two embedded blocks 101 enclose a semi-closed ring structure.

It is to be noted that a central axis of the annular structure may coincide with that of the conductive pillar.

Figure 10:
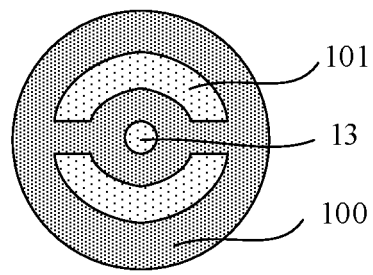
FIG. 10 is a seventh schematic sectional structural diagram of one end of a conductive pillar provided with an embedded block according to an embodiment of the present disclosure.

Example 4: Referring to FIG. 10, in addition to the annular structure enclosed by the at least one embedded block 101, the embedded block 101 further includes a third embedded block 13. A central axis of the third embedded block 13 coincides with that of the conductive pillar 100.

In this embodiment, on the one hand, a plurality of third embedded blocks 13 are added on the basis of the annular structure, which can further reduce the overall coefficient of thermal expansion of the conductive structure; on the other hand, when a number of the third embedded block 13 is fixed and each third embedded block 13 has a fixed shape and size, the central axis of the third embedded block 13 coincides with that of the conductive pillar 100, so that the third embedded block 13 located in the conductive pillar 100 can have a maximum total volume, and an effect of reducing the overall coefficient of thermal expansion of the conductive structure is better.

Figure 11:
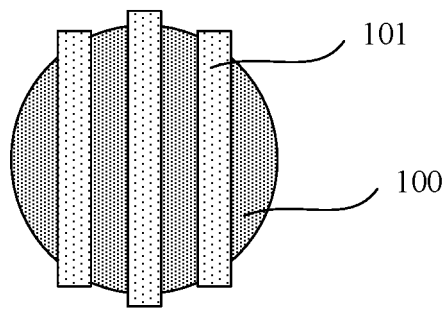
FIG. 11 is an eighth schematic sectional structural diagram of one end of a conductive pillar provided with an embedded block according to an embodiment of the present disclosure.

Referring to FIG. 11, the embedded block 101 includes a plurality of fin-shaped structures, some of which extend beyond the conductive pillar 100.

In this embodiment, the fin-shaped structures are long strip structures with thin layers, some of which extend beyond the conductive pillar 100, so that a transition structure exists between the conductive pillar 100 and the structure adjacent to the conductive pillar 100. When the conductive pillar 100 is heated and expanded and generates a large thermal expansion stress, the transition structure can block or disperse part of the thermal expansion stress, so as to reduce the influence of the thermal expansion stress on the structure adjacent to the conductive pillar. In other embodiments, the fin-shaped structure may be completely located in the conductive pillar.

It is to be noted that, in addition to the situations listed above, the embedded block 101 in the conductive structure may also have other shapes, numbers and arrangements. It is clear to those skilled in the art that the above schematic structure is intended to facilitate those skilled in the art to understand the conductive structure according to this embodiment, which does not mean that the embedded block 101 in the conductive structure includes only the situations listed above.

In this embodiment, the coefficient of thermal expansion of the embedded block 101 is less than that of the conductive pillar 100, which helps reduce an overall coefficient of thermal expansion of the conductive pillar 100, so that, when the conductive pillar 100 is heated and expanded, an expansion volume of the conductive pillar 100 decreases, thereby helping reduce an extrusion effect of the conductive pillar 100 on the structure adjacent to the conductive pillar 100.

Correspondingly, an embodiment of the present disclosure further provides a semiconductor structure including the above conductive structure.

Figure 12:
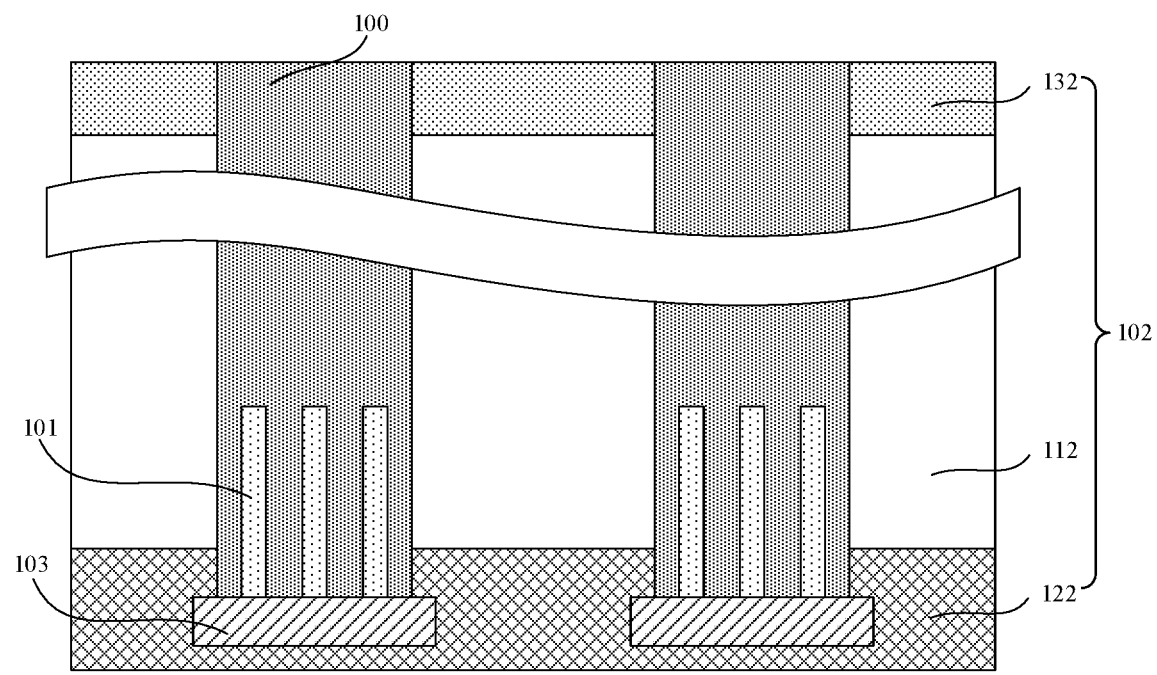
FIG. 12 is a schematic sectional structural diagram of a semiconductor structure according to an embodiment of the present disclosure.
Figure 13:
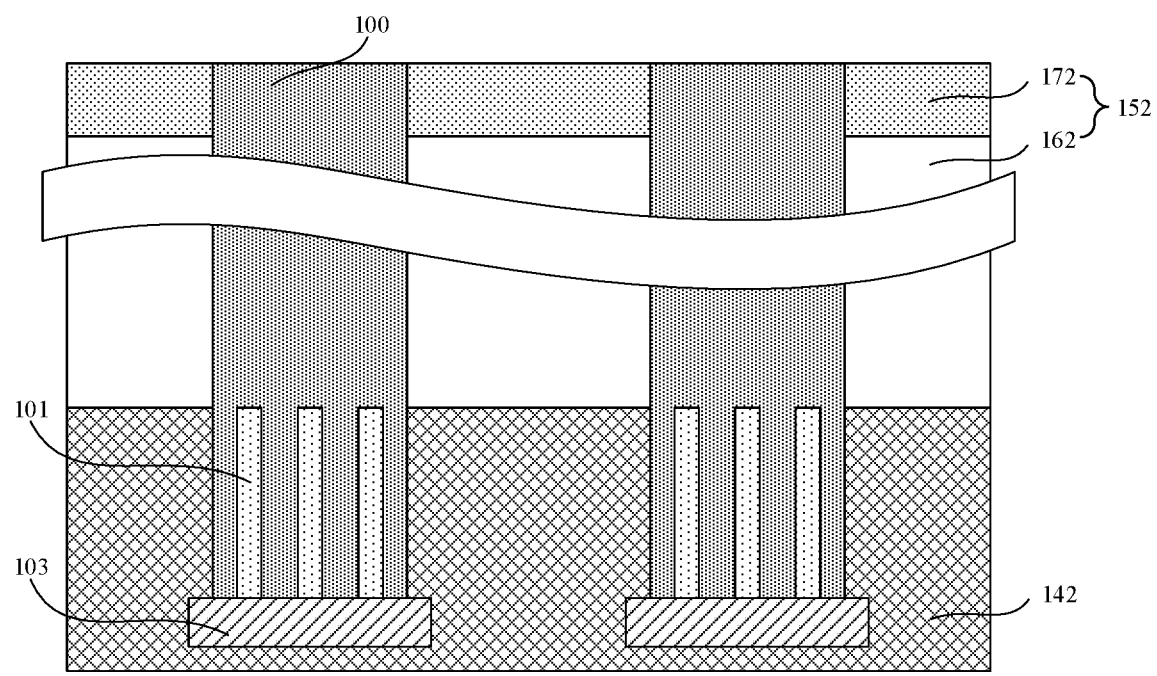
FIG. 13 is another schematic sectional structural diagram of the semiconductor structure according to an embodiment of the present disclosure.

FIG. 12 is a schematic sectional structural diagram of a semiconductor structure according to an embodiment of the present disclosure. FIG. 13 is another schematic sectional structural diagram of the semiconductor structure according to an embodiment of the present disclosure.

Referring to FIG. 12, in this embodiment, a semiconductor includes: a base 102; and the conductive structure according to the above embodiment, the conductive structure being located in the base 102.

The conductive structure is provided with an embedded block 101 and a coefficient of thermal expansion of the embedded block 101 is less than that of the conductive pillar 100, which helps reduce a difference between the overall coefficient of thermal expansion of the conductive structure and a coefficient of thermal expansion of the base 102. When the semiconductor structure is heated and expanded, on the one hand, an expansion volume of the conductive structure decreases, which helps reduce an extrusion effect of the conductive structure on the base 102; on the other hand, the conductive structure can play a role of heat conduction and heat dissipation, so as to prevent damages to the semiconductor structure due to an excess temperature.

The semiconductor structure further includes: an electrical connection layer 103. The electrical connection layer 103 is located in the base 102, the conductive pillar 100 is electrically connected to the electrical connection layer 103, one end of the conductive pillar 100 facing the electrical connection layer 103 is provided with the at least one embedded block 101, and along an extension direction of the conductive pillar 100, a distance between the embedded block 101 and the electrical connection layer 103 is within a preset range.

Specifically, in this embodiment, the electrical connection layer 103 is a metal layer, and the embedded block 101 is arranged at one end of the conductive pillar 100 facing the electrical connection layer 103, which helps reduce the coefficient of thermal expansion of the conductive structure in the part, so that, when the conductive structure is heated and expanded, an extrusion effect of the conductive structure on the electrical connection layer 103 due to volume expansion is reduced, thereby preventing deformation of the electrical connection layer 103 due to the extrusion effect and helping improve the stability of the electrical connection between the conductive pillar 100 and the electrical connection layer 103.

In other embodiments, the electrical connection layer may also be located in a doped region of the substrate, such as a region doped with N-type impurity ions or a region doped with P-type impurity ions in the substrate. Further, the electrical connection layer may also be located in a metal silicide region of the substrate, such as a nickel silicide region or a cobalt silicide region of the substrate.

Further, the distance between the embedded block 101 and the electrical connection layer 103 is within the preset range of 5 nm to 50 nm. Within the preset range, the distance between the embedded block 101 and the electrical connection layer 103 is relatively small, so the coefficient of thermal expansion of the conductive structure at the end near the electrical connection layer 103 is greatly affected by the embedded block 101. When the conductive structure is heated and expanded, the expansion volume of the conductive structure at the electrical connection with the electrical connection layer 103 can be further reduced, and the extrusion effect of the conductive structure here on the electrical connection layer 103 can be reduced, so that the electrical connection layer 103 is not easy to deform, thereby ensuring the stability of the electrical connection between the conductive structure and the electrical connection layer 103.

Specifically, in this embodiment, the embedded block 101 may include: a first embedded block and a second embedded block, a central axis of the first embedded block coincides with that of the conductive pillar 100, a plurality of second embedded blocks are spaced around the first embedded block, and along the extension direction of the conductive pillar 100, a distance between the electrical connection layer 103 and the first embedded block is less than that between the electrical connection layer 103 and the second embedded block.

An orthographic projection of the first embedded block on a surface of the electrical connection layer 103 corresponds to a center of the electrical connection layer 103. The smaller the distance between the first embedded block and the electrical connection layer 103, the smaller the coefficient of thermal expansion of the conductive structure connected to the center of the electrical connection layer 103, which is more conducive to reduction of the extrusion effect on the electrical connection layer 103 when the conductive structure here is heated and expanded.

In other embodiments, along the extension direction of the conductive pillar, a distance between the electrical connection layer and the first embedded block may also be greater than or equal to that between the electrical connection layer and the second embedded block.

A detailed description of the embedded block can be obtained with reference to the description in the foregoing embodiment, which is not described in detail herein.

In this embodiment, the embedded block 101 is in contact with the electrical connection layer 103; on the one hand, a contact area between the conductive pillar 100 and the electrical connection layer 103 is reduced, and when the conductive pillar 100 is heated and expanded, an acting area of the electrical connection layer 103 is reduced, which helps reduce an extrusion effect of the conductive pillar 100 on the electrical connection layer 103; on the other hand, the embedded block 101 is in direct contact with the electrical connection layer 103, which can further reduce an overall coefficient of thermal expansion of the conductive structure at the contact with the electrical connection layer 103, thereby reducing the extrusion effect on the electrical connection layer when the conductive structure is heated and expanded.

In this embodiment, referring to FIG. 12, the base 102 includes: a substrate 112 and a dielectric layer 122 sequentially stacked; the electrical connection layer 103 is located in the dielectric layer 122; the embedded block 101 is located at least in the dielectric layer 122; and the conductive pillar 100 passes through the substrate 112 and is partially located in the dielectric layer 122.

Specifically, the base 102 may further include: a hard mask layer 132. The hard mask layer 132 is located on one side of the base 102 away from the embedded block 101. The embedded block 101 is further located in the substrate 112.

The substrate 112 may be a silicon substrate. In other embodiments, the substrate may also be a germanium substrate, a silicon germanium substrate, a silicon carbide substrate, a silicon on insulator substrate or the like. The dielectric layer 122 may be of a monolayer structure or a multi-layer stack structure, and the dielectric layer 122 includes devices such as a resistor, a capacitor and a transistor to ensure the normal operation of the semiconductor structure.

In another embodiment, referring to FIG. 13, the base 102 includes: a first wafer 142 and a second wafer 152 sequentially stacked; the electrical connection layer 103 is located in the first wafer 142; the embedded block 101 is located in the first wafer 142; and the conductive pillar 100 passes through the second wafer 152 and is further located in a partial thickness portion of the first wafer 142. The first wafer 142 is bonded to the second wafer 152.

Specifically, a top of the embedded block 101 is flush with that of the first wafer 142. In other embodiments, the top of the embedded block may also be lower than that of the first wafer.

In this embodiment, the conductive pillar 100 in the semiconductor structure is provided with the embedded block 101 and the coefficient of thermal expansion of the embedded block 101 is less than that of the conductive pillar 100, which helps reduce the overall coefficient of thermal expansion of the conductive structure. When the conductive structure is heated and expanded, the expansion volume of the conductive structure is reduced, and the extrusion effect of the conductive structure on the electrical connection layer 103 can be reduced, so that the electrical connection layer 103 is not easy to deform, thereby ensuring the stability of the electrical connection between the conductive pillar 100 in the conductive structure and the electrical connection layer 103.

Correspondingly, an embodiment of the present disclosure further provides a manufacturing method of a semiconductor structure with the conductive structure, including: providing a base; etching the base to form at least one first through hole; filling the first through hole to form an embedded block; etching the base to form at least one second through hole, at least one embedded block being located in the second through hole; and filling the second through hole to form a conductive pillar, a coefficient of thermal expansion of the embedded block being less than that of the conductive pillar.

Since the overall coefficient of thermal expansion of the conductive pillar formed is small, the conductive structure has a small expansion volume when heated and expanded, and then the conductive structure has less extrusion on the base and other structures adjacent to the conductive structure, which reduces the probability of damages to the base and other structures adjacent to the conductive structure due to the extrusion of the conductive structure.

In other embodiments, the embedded block may not be located in the second through hole; that is, the embedded block is not located in a subsequently-formed conductive pillar. Specifically, the base is etched to form at least one first through hole, a partial region of the first through hole is filled to form an embedded block, and then the remaining part of the first through hole is filled to form a conductive pillar, so that an end surface of the conductive pillar is in contact with that of the embedded block.

Figure 14:
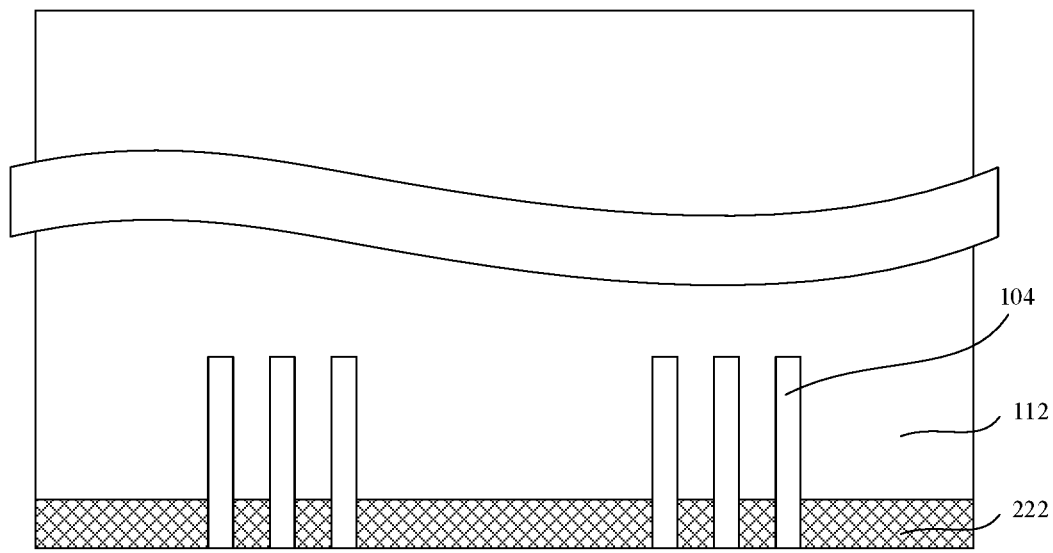
FIG. 14 is a first schematic sectional structural diagram corresponding to a step of a semiconductor structure manufacturing method according to an embodiment of the present disclosure.
Figure 15:
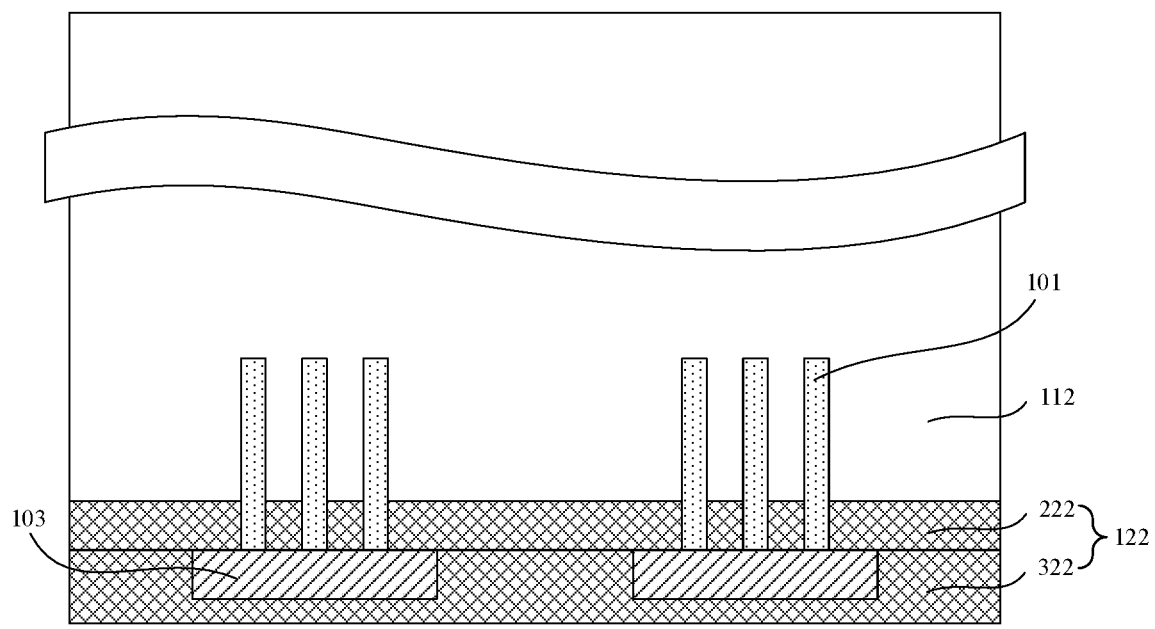
FIG. 15 is a second schematic sectional structural diagram corresponding to a step of a semiconductor structure manufacturing method according to an embodiment of the present disclosure.
Figure 16:
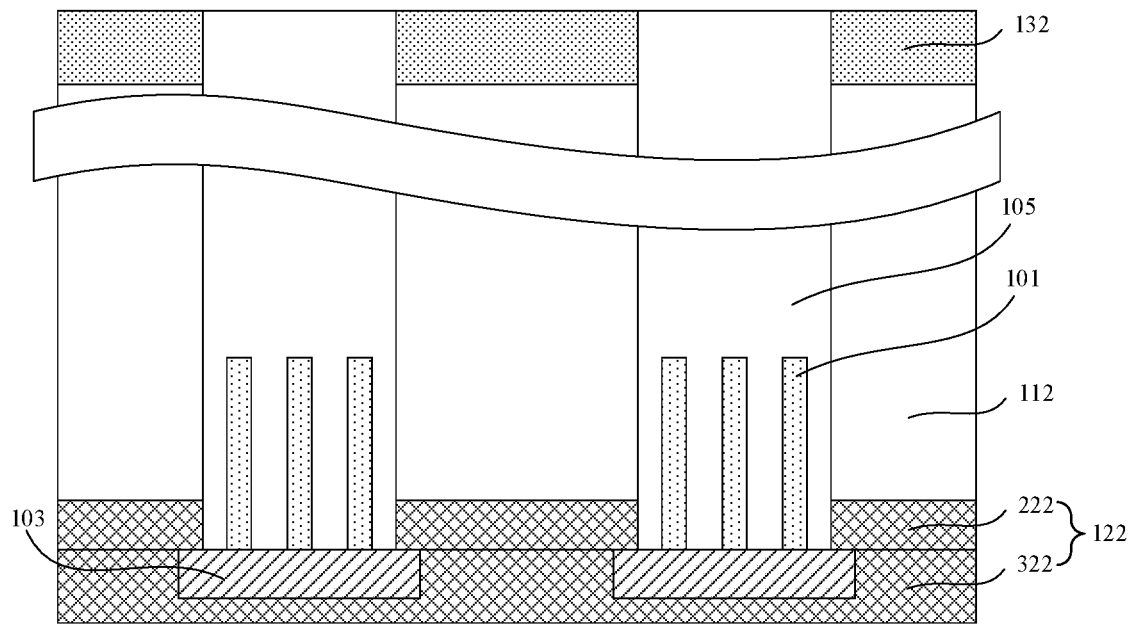
FIG. 16 is a third schematic sectional structural diagram corresponding to a step of a semiconductor structure manufacturing method according to an embodiment of the present disclosure.

A semiconductor structure manufacturing method according to a first embodiment of the present disclosure is described below with reference to the drawings. FIG. 14 to FIG. 16 illustrate the semiconductor structure manufacturing method according to the first embodiment of the present disclosure.

Referring to FIG. 14 and FIG. 15, a base 102 (refer to FIG. 12) is provided, the base 102 including: a substrate 112 and a dielectric layer 122 sequentially stacked; and an embedded block 101 and an electrical connection layer 103 are formed in the substrate 112 and/or the dielectric layer 122.

Specifically, in this embodiment, the embedded block 101 is formed in both the substrate 112 and the dielectric layer 122, and the electrical connection layer 103 is formed in the dielectric layer 122.

In other embodiments, the embedded block and the dielectric layer may be formed only in the substrate or the embedded block and the dielectric layer may be formed only in the dielectric layer.

In this embodiment, for example, the electrical connection layer 103 is formed after the embedded block 101 is formed. Specifically, a process step for forming the dielectric layer 122, the embedded block 101 and the electrical connection layer 103 is as follows.

Referring to FIG. 14, a first dielectric layer 222 is formed on the substrate 112; a first through hole 104 passing through the first dielectric layer 222 is formed, and the first through hole 104 is also located in the substrate 112.

The first through hole 104 acts as a process basis for subsequent formation of the embedded block 101. Specifically, a first photomask is provided, and the first dielectric layer 222 and the substrate 112 are etched with the first photomask as a mask to form at least one first through hole 104.

Referring to FIG. 15, the embedded block 101 is formed in the substrate 112 and the first dielectric layer 222.

Specifically, the first through hole 104 is filled to form the embedded block 101. For example, the first through hole 104 is filled with an embedded material. The embedded material is further located on the first dielectric layer 222. The embedded material located on the first dielectric layer 222 may be removed by chemical mechanical polishing, so as to form the embedded block 101 filling the first through hole 104. The embedded material includes a silicon-containing material or a metal material.

Still referring to FIG. 15, a second dielectric layer 322 is formed on one side of the first dielectric layer 222 away from the substrate 112, and an electrical connection layer 103 is formed in the second dielectric layer 322. The first dielectric layer 222 and the second dielectric layer 322 jointly form the dielectric layer 122.

It is to be noted that, in other embodiments, the embedded block may be formed after the electrical connection layer is formed.

Referring to FIG. 16, along a direction of the substrate 112 pointing to the dielectric layer 122, the substrate 112 is etched until the electrical connection layer 103 is exposed, so as to form the second through hole 105.

Specifically, a hard mask layer 132 is further formed on one side of the substrate 112 away from the electrical connection layer 103, and a second photomask is provided. Firstly, the hard mask layer 132 is etched with the second photomask, and a pattern on the second photomask is accurately transferred to the hard mask layer 132. Then, the substrate 112 and the second dielectric layer 322 are etched with the hard mask layer 132 as a mask, so as to form a through hole 105. Since the hard mask layer 132 and the substrate 112 have a high etch selectivity ratio, during the etch of the substrate, the substrate 112 not exposed by the hard mask layer 132 is affected slightly by an etch process.

Still referring to FIG. 12, the second through hole 105 is filled to form the conductive pillar 100.

Correspondingly, the electrical connection layer 103 is formed in the base 102, and the electrical connection layer 103 is electrically connected to the conductive pillar 100; the at least one embedded block 101 is formed at one end of the conductive pillar 100 facing the electrical connection layer 103, and along an extension direction of the conductive pillar 100, a distance between the embedded block 101 and the electrical connection layer 103 is within a preset range.

In the above embodiment, the formation of the electrical connection layer 103 and the conductive pillar 100 within a same wafer is illustrated.

Figure 17:
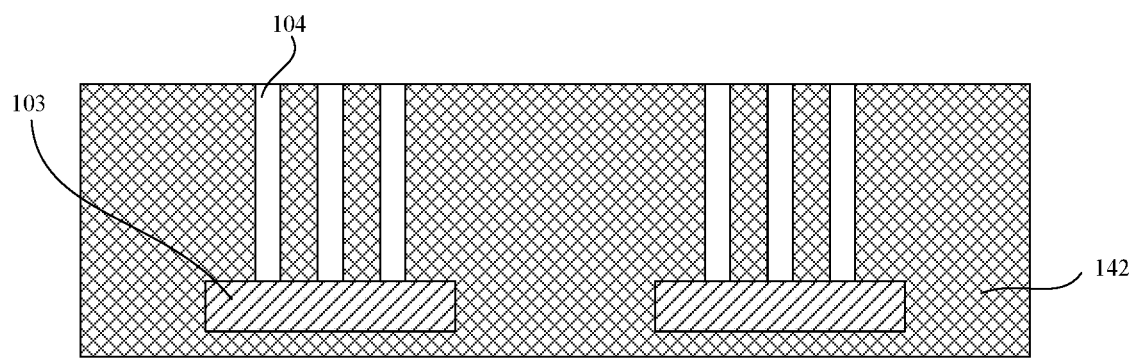
FIG. 17 is a first schematic sectional structural diagram corresponding to a step of a semiconductor structure manufacturing method according to another embodiment of the present disclosure.
Figure 18:
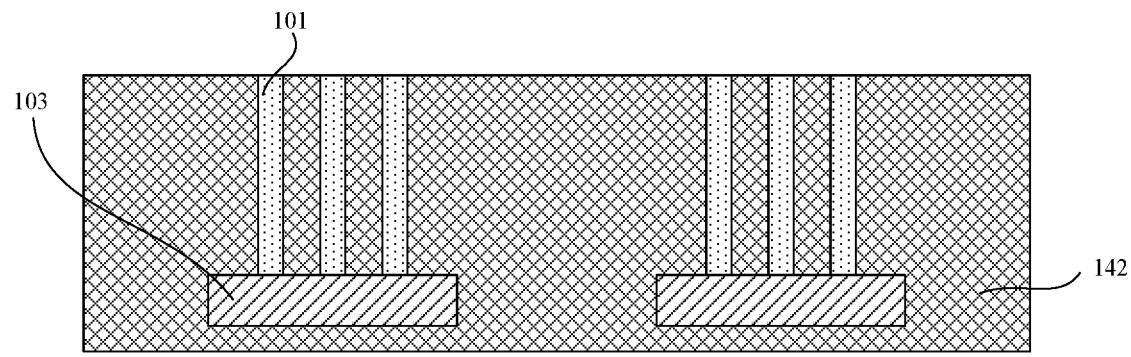
FIG. 18 is a second schematic sectional structural diagram corresponding to a step of a semiconductor structure manufacturing method according to another embodiment of the present disclosure.
Figure 19:
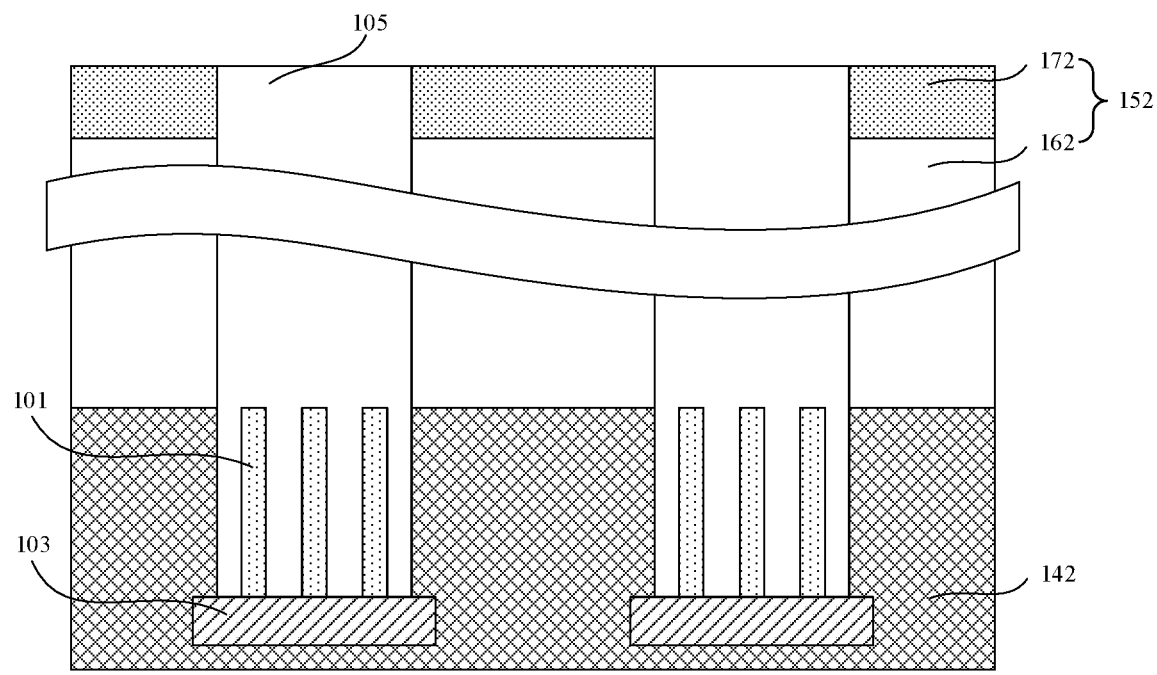
FIG. 19 is a third schematic sectional structural diagram corresponding to a step of a semiconductor structure manufacturing method according to another embodiment of the present disclosure.

A second embodiment of the present disclosure further provides a semiconductor structure manufacturing method, which is substantially the same as the foregoing embodiment. A main difference lies in that a method of forming an electrical connection layer and a conductive pillar based on two wafers is illustrated in the second embodiment of the present disclosure. The semiconductor structure manufacturing method according to the second embodiment of the present disclosure is described in detail below with reference to the drawings. FIG. 17 to FIG. 19 illustrate the semiconductor structure manufacturing method according to the second embodiment of the present disclosure.

Referring to FIG. 13 and FIG. 17, a base is provided, the base including: a first wafer 142 and a second wafer 152 sequentially stacked. A process step for forming the electrical connection layer 103, the conductive pillar 100 and the embedded block 101 is as follows.

Referring to FIG. 17, the first wafer 142 is provided, and the electrical connection layer 103 is formed in the first wafer 142.

Specifically, the electrical connection layer 103 is formed in the first wafer 142 first, a first photomask is provided, and the first wafer 142 is etched with the first photomask as a mask to expose the electrical connection layer 103, so as to form at least one first through hole 104, which acts as a process basis for the subsequent formation of the embedded block 101.

Referring to FIG. 17, the first wafer 142 is etched to form the first through hole 104; the first through hole 104 is filled to form the embedded block 101.

Specifically, the first through hole 104 is filled with an embedded material. The embedded material is further located on the first wafer 142. The embedded material located on the first wafer 142 may be removed by chemical mechanical polishing, so as to form the embedded block 101 filling the first through hole 104. The embedded material includes a silicon-containing material or a metal material.

Referring to FIG. 19, the second wafer 152 is provided, and the second wafer 152 is bonded to the first wafer 142; along a direction of the second wafer 152 pointing to the first wafer 142, the first wafer 142 and the second wafer 152 are etched until the electrical connection layer 103 is exposed, so as to form the second through hole 105.

Specifically, the second wafer 152 includes a substrate 162 and a dielectric layer 172. The second wafer 152 may be bonded to the first wafer 142 by a direct wafer bonding process or a binder bonding process.

A process step for forming the second through hole 105 includes: providing a patterned second photomask; and along the direction of the second wafer 152 pointing to the first wafer 142, the first wafer 142 and the second wafer 152 are etched with the second photomask as a mask until the electrical connection layer 103 is exposed, so as to form the second through hole 105.

Still referring to FIG. 13, the second through hole 105 (refer to FIG. 19) is filled to form the conductive pillar 100.

Based on the above, in the manufacturing method of the semiconductor structure including the conductive structure according to the embodiment of the present disclosure, the conductive pillar 100 is provided with an embedded block 101 having a smaller coefficient of thermal expansion than the conductive pillar 100, which helps reduce the overall coefficient of thermal expansion of the conductive structure formed. Therefore, when the conductive structure is heated and thermally expanded, the expansion volume of the conductive structure decreases, which helps reduce the extrusion effect of the conductive structure on the electrical connection layer 103.

Those of ordinary skill in the art may understand that the above implementations are specific embodiments for implementing the present disclosure. However, in practical applications, various changes in forms and details may be made thereto without departing from the spirit and scope of the present disclosure. Any person skilled in the art can make respective changes and modifications without departing from the spirit and scope of the present disclosure. Therefore, the protection scope of the present disclosure should be subject to the scope defined by the claims.

What is claimed is:

1. A semiconductor structure, comprising:
a base comprising a substrate, a first dielectric layer on the substrate, and a second dielectric layer on one side of the first dielectric layer away from the substrate;
an electrical connection layer, the electrical connection layer being located in the second dielectric layer; and
a conductive structure being located in the base, wherein the conductive structure comprises:
a conductive pillar being passed through the substrate and the first dielectric layer and being electrically connected to the electrical connection layer; and
at least one embedded block being located in the substrate and in the first dielectric layer, wherein the at least one embedded block is provided at one end of the conductive pillar facing the electrical connection layer and is in contact with the conductive pillar;
wherein a coefficient of thermal expansion of the at least one embedded block is less than that of the conductive pillar; and
a distance between the at least one embedded block and the electrical connection layer is within a preset range along a direction perpendicular to the surface of the substrate, and the preset range is 5-50 nm.

2. The semiconductor structure according to claim 1, wherein the at least one embedded block is made of a silicon-containing material or a metal material.

3. The semiconductor structure according to claim 1, wherein the at least one embedded block comprises: at least one first embedded block, and a central axis of the first embedded block coincides with that of the conductive pillar.

4. The semiconductor structure according to claim 3, wherein the at least one embedded block further comprises: a plurality of second embedded blocks spaced around the first embedded block.

5. The semiconductor structure according to claim 1, wherein the at least one embedded block encloses an annular structure.

6. The semiconductor structure according to claim 5, wherein the at least one embedded block further comprises: a third embedded block, and a central axis of the third embedded block coincides with that of the conductive pillar.

7. The semiconductor structure according to claim 1, the at least one embedded block comprises: a plurality of fin-shaped structures, some of which extend beyond the conductive pillar.

8. A semiconductor structure manufacturing method, comprising:
providing a substrate, and forming a first dielectric layer on the substrate;
etching the substrate and the first dielectric layer to form at least one first through hole;
filling the first through hole to form an embedded block;
forming a second dielectric layer on one side of the first dielectric layer away from the substrate, and forming an electrical connection layer in the second dielectric layer, wherein the substrate, the first dielectric layer and the second dielectric layer are formed as a base;
etching the substrate and the first dielectric layer until the electrical connection layer is exposed to form at least one second through hole, at least one embedded block being located in the second through hole; and
filling the second through hole to form a conductive pillar, a coefficient of thermal expansion of the embedded block being less than that of the conductive pillar.

9. The semiconductor structure manufacturing method according to claim 8, wherein
the electrical connection layer is electrically connected to the conductive pillar; and
the at least one embedded block is formed at one end of the conductive pillar facing the electrical connection layer, wherein a distance between the embedded block and the electrical connection layer is within a preset range along a direction perpendicular to the surface of the substrate and the preset range is 5-50 nm.

10. The semiconductor structure manufacturing method according to claim 8, wherein
the electrical connection layer is electrically connected to the conductive pillar; and
the at least one embedded block is formed at one end of the conductive pillar facing the electrical connection layer;
wherein the embedded block is in contact with the electrical connection layer.

* * * * *